United States Patent
Visokay et al.

(10) Patent No.: US 7,183,221 B2
(45) Date of Patent: Feb. 27, 2007

(54) METHOD OF FABRICATING A SEMICONDUCTOR HAVING DUAL GATE ELECTRODES USING A COMPOSITION-ALTERED METAL LAYER

(75) Inventors: Mark R. Visokay, Richardson, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 10/703,388

(22) Filed: Nov. 6, 2003

(65) Prior Publication Data

US 2005/0101145 A1    May 12, 2005

(51) Int. Cl.
*H01L 21/302* (2006.01)
(52) U.S. Cl. .................... 438/719; 438/199
(58) Field of Classification Search ............ 438/157, 438/176, 199, 585–587, 694, 700, 702, 703, 438/706, 719–722
See application file for complete search history.

(56) References Cited

U.S. PATENT DOCUMENTS

| | | | |
|---|---|---|---|
| 4,462,151 A | 7/1984 | Geipel, Jr. et al. | 438/220 |
| 5,619,057 A | 4/1997 | Komatsu | 257/382 |
| 5,719,083 A | 2/1998 | Komatsu | 438/652 |
| 5,801,398 A | 9/1998 | Hebiguchi | 257/66 |
| 5,907,789 A | 5/1999 | Komatsu | 438/649 |
| 6,436,840 B1 | 8/2002 | Besser et al. | 438/721 |
| 6,518,106 B2* | 2/2003 | Ngai et al. | 438/157 |
| 6,586,288 B2* | 7/2003 | Kim et al. | 438/183 |
| 6,642,590 B1 | 11/2003 | Besser et al. | 257/410 |
| 6,645,798 B2* | 11/2003 | Hu | 438/197 |
| 6,750,503 B2* | 6/2004 | Ohnishi et al. | 257/315 |
| 6,809,394 B1* | 10/2004 | Visokay | 257/500 |
| 6,831,343 B2* | 12/2004 | Hu | 257/454 |
| 6,872,613 B1* | 3/2005 | Xiang et al. | 438/199 |
| 7,030,430 B2* | 4/2006 | Doczy et al. | 257/249 |
| 2005/0054149 A1* | 3/2005 | Xiang et al. | 438/199 |
| 2005/0184345 A1* | 8/2005 | Lin et al. | 257/375 |

* cited by examiner

*Primary Examiner*—Kin-Chan Chen
(74) *Attorney, Agent, or Firm*—Jacqueline J. Garner; W. James Brady, III; Frederick J. Telecky, Jr.

(57) ABSTRACT

Fabricating a semiconductor includes depositing a metal layer outwardly from a dielectric layer and forming a mask layer outwardly from a first portion of the metal layer. Atoms are incorporated into an exposed second portion of the metal layer to form a composition-altered portion of the metal layer. The mask layer is removed from the first portion of the metal layer and a barrier layer is deposited outwardly from the metal layer. A poly-Si layer is deposited outwardly from the barrier layer to form a semiconductor layer, where the barrier layer substantially prevents reaction of the metal layer with the poly-Si layer. The semiconductor layer is etched to form gate stacks, where each gate stack operates according to one of a plurality of work functions.

15 Claims, 2 Drawing Sheets

METHOD OF FABRICATING A SEMICONDUCTOR HAVING DUAL GATE ELECTRODES USING A COMPOSITION-ALTERED METAL LAYER

TECHNICAL FIELD

This invention relates generally to the field of integrated circuit fabrication and specifically to a semiconductor structure and method of fabrication.

BACKGROUND OF THE DISCLOSURE

Transistors are generally fabricated by forming gate stacks on a semiconducting substrate. A gate stack typically includes a layer of polycrystalline silicon (poly-Si) on a gate dielectric. The poly-Si layer may be doped in order to set the work function of the poly-Si and reduce its resistivity. This technique of gate stack fabrication, however, may result in the formation of a relatively thick depletion layer. The thick depletion layer may cause a reduction in the overall gate capacitance, which may decrease the drive current of a device, resulting in the degradation of device performance. Thus, it may be challenging to dope poly-Si to a sufficiently high level to minimize depletion.

Known techniques to reduce this effect of the depletion layer may include increasing the doping level of the poly-Si. This known technique, however, may be difficult to implement because there is a limit to the number of carriers that can be attained by doping. Another known technique may involve using a metal layer instead of the doped poly-Si layer to increase the overall gate capacitance and to reduce the formation of the depletion layer. This technique, however, may be unsatisfactory because the metal may react with adjacent layers when exposed to high temperatures during a fabrication flow. The effect of the reaction of the metal with an adjacent layer may be reduced by using a thick metal layer or by limiting the thermal budget of the device, both of which may also affect the size and performance of the semiconductor device. Consequently, known techniques for fabricating a semiconductor structure may be unsatisfactory in certain situations.

SUMMARY OF THE DISCLOSURE

In accordance with the present invention, disadvantages and problems associated with previous techniques for fabricating a semiconductor structure may be reduced or eliminated.

According to one embodiment, fabricating a semiconductor includes depositing a metal layer outwardly from a dielectric layer and forming a mask layer outwardly from a first portion of the metal layer, where the mask layer masks the first portion of the metal layer. A plurality of atoms is incorporated into an exposed second portion of the metal layer to alter the composition of the metal layer. The mask layer is removed from the first portion of the metal layer and a barrier layer is deposited outwardly from the first portion and the second portion of the metal layer. A poly-Si layer is deposited outwardly from the barrier layer to form a gate film stack, where the barrier layer substantially prevents reaction of the metal layer with the poly-Si layer. The gate film stack is etched to form a gate stack structure that includes a first gate stack and a second gate stack, where the first gate stack includes at least part of the first portion of the metal layer and operates according to a first work function, and where the second gate stack includes at least part of the composition-altered portion of the metal layer and operates according to a second work function by virtue of the composition alteration.

Certain embodiments of the invention may provide one or more technical advantages. A technical advantage of one embodiment may include a barrier layer that prevents reaction of the metal layer with adjacent layers in order to inhibit the formation of metal compounds. Use of a barrier layer may allow the use of a metal layer in semiconductor fabrication, while maintaining the integrity of the metal layer throughout the thermal budget of the device. Another technical advantage may be that a thin metal layer may be used, which may allow for more effective etching of the gate stack. Yet another technical advantage of one embodiment may be that a dual work function gate structure using metal gates may be obtained. Yet another technical advantage of one embodiment may be that a metal layer may be used to effectively control implantation of atoms into the metal layer, which may prevent possible damage to the gate dielectric.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1 illustrates a metal layer deposited outwardly from a dielectric layer;

FIG. 2 illustrates a mask layer formed outwardly from the metal layer 12 protect at least a portion of the metal layer;

FIG. 3 illustrates a process to locally change the film composition of an exposed portion of the metal layer;

FIG. 4 illustrates removal of the mask layer;

FIG. 5 illustrates a barrier layer deposited outwardly from the metal layer;

FIG. 6 illustrates a poly-silicon (poly-Si) layer deposited outwardly from the barrier layer; and FIG. 7 illustrates formation of a gate structure having dual work function metal gates.

DETAILED DESCRIPTION OF THE DRAWINGS

Embodiments of the present invention and its advantages are best understood by referring to FIGS. 1 through 7 of the drawings, like numerals being used for like and corresponding parts of the various drawings.

FIGS. 1 through 7 are a series of schematic cross-sectional diagrams illustrating an embodiment of a method for fabricating a semiconductor structure. The method illustrated in FIGS. 1 through 7 may be used to fabricate p-channel metal oxide semiconductor (PMOS) and n-channel metal oxide semiconductor (NMOS) devices.

Transistors are typically fabricated by forming gate stacks on a semiconducting substrate. A gate stack typically includes a layer of polycrystalline silicon (poly-Si) on a gate dielectric. The poly-Si layer may be doped with different dopants in order to set the work function of the poly-Si and reduce its resistivity. For example, boron may be used to set the work function of the poly-Si for PMOS transistors, and phosphorous may be used to set the work function for NMOS transistors.

This technique of gate stack fabrication, however, may result in the formation of a depletion layer that is thicker than desired for ultra-scaled transistors. The solubility limit of the dopants in the poly-Si may lead to a carrier concentration lower than that required to decrease the depletion to negligible levels, which may result in a thicker depletion layer. The depletion layer may cause a reduction in the overall gate capacitance, which may decrease the drive current of a device, resulting in the degradation of device performance. The dopant concentration may be increased by using higher activation temperatures, but this may be impractical since the thermal budget of CMOS devices is decreasing rather than increasing. The illustrated embodiment, however, may allow for sufficient doping of the poly-Si layer to reduce depletion.

Figure 1:
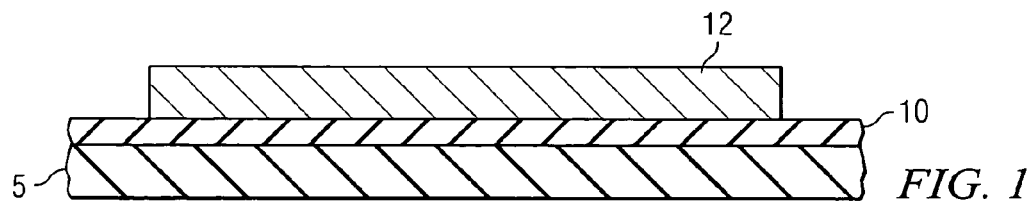
FIGS. 1 through 7 are a series of schematic cross-sectional diagrams illustrating an embodiment of a method for fabricating a semiconductor structure in accordance with the present invention, where.

Referring to FIG. 1, a metal layer 12 is deposited outwardly from a dielectric layer 10 disposed outwardly from a silicon substrate 5. Silicon substrate 5 may comprise silicon or any other suitable semiconductive material. Dielectric layer 10 may comprise an insulator material such as silicon dioxide ($SiO_2$). Any other material suitable for forming a gate oxide layer may be used, such as HfSiON, ZrSiON, HfON, or ZrON. According to one embodiment, dielectric layer 10 may be formed by exposing a silicon layer to an oxidation environment, such as by thermal oxidation. Any other suitable procedure for forming dielectric layer 10 may be used without departing from the scope of the invention, for example, any suitable chemical vapor deposition process, any suitable physical vapor deposition process, any suitable atomic layer deposition process, or other suitable gate dielectric deposition process. Additionally, dielectric layer 10 may be disposed outwardly from any substrate material such as a silicon wafer, a Silicon-on Insulator (SOI) wafer, bulk CMOS wafer, or any other suitable wafer.

Metal layer 12 may comprise any metal compound suitable for forming metal gates. According to the illustrated embodiment, metal layer 12 comprises a molybdenum (Mo) layer, and has a thickness in a range between 5 angstroms and 500 angstroms. At a minimum, metal layer 12 may have a thickness of one monolayer.

Figure 2:
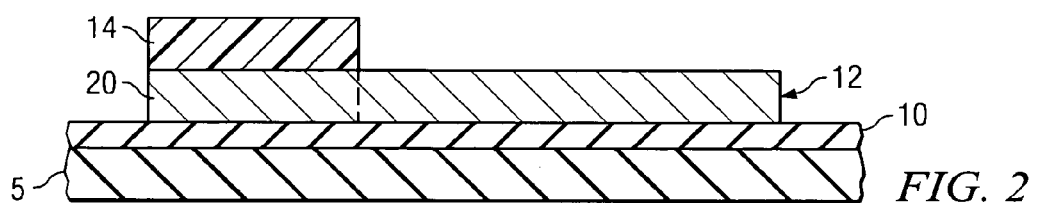

Referring to FIG. 2, a mask layer 14 is formed outwardly from metal layer 12 to protect at least a portion of metal layer 12. Mask layer 14 may comprise any material suitable for masking metal layer 12. For example, mask layer 14 may comprise a photoresist material, a hard mask, or any other suitable masking material. According to the illustrated embodiment, mask layer 14 is formed outwardly from metal layer 12 to protect a first portion 20 of metal layer 12. Mask layer 14 may be formed according to any pattern suitable for preparing metal layer 12 for a process 16 as is described with reference to FIG. 3.

Figure 3:
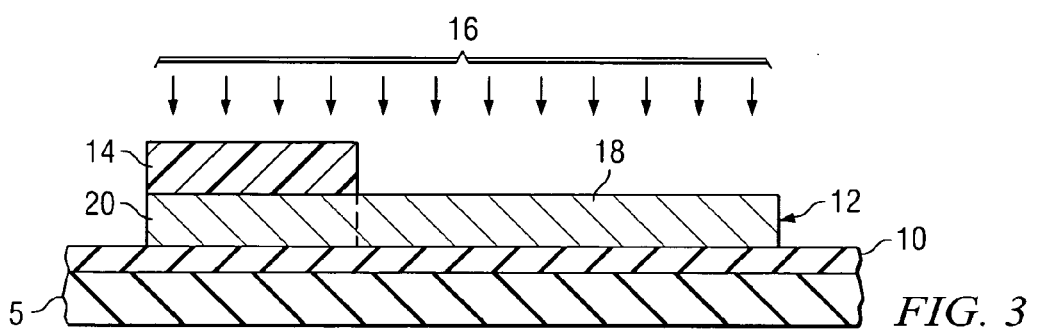

Referring to FIG. 3, a process 16 to locally change the film composition is performed on an exposed portion 18 of metal layer 12. Process 16 may incorporate any species suitable for reacting with metal layer 12. For example, process 16 may incorporate nitrogen into the film of exposed portion 18. Other possible processes 16 may use carbon, boron, or silicon atoms. According to the illustrated embodiment, process 16 may be performed using direct plasma nitridation, ion implantation, remote plasma nitridation, ammonia ($NH_3$) anneal, a silicon anneal such as a $S_iH_4$ or $Si_2H_6$ anneal, or any other process suitable for incorporating nitrogen or silicon into exposed portion 18 of metal layer 12. The nitrogen may be incorporated into exposed portion 18 of metal layer 12 using any dosage suitable for imparting sufficient nitridation of exposed portion 18 of metal layer 12.

Mask layer 14 is operable to prevent at least a portion of the nitrogen from penetrating first portion 20 of metal layer 12. As was described with reference to FIG. 2, mask layer 14 is formed in any pattern suitable from protecting first portion 20 of metal layer 12. If process 16 comprises ion implantation, mask layer 14 may comprise a photoresist material operable to substantially prevent ion implantation at first portion 20. If process 16 comprises nitridation by plasma nitridation or an ammonia ($NH_3$) anneal, mask layer 14 may comprise a hard mask such as silicon nitride (SiN), silicon oxide (SiO), SiON, or any other hardmask that does not react with the underlying material and can be easily removed that may prevent the nitrogen from substantially penetrating first portion 20 of metal layer 12.

Figure 4:
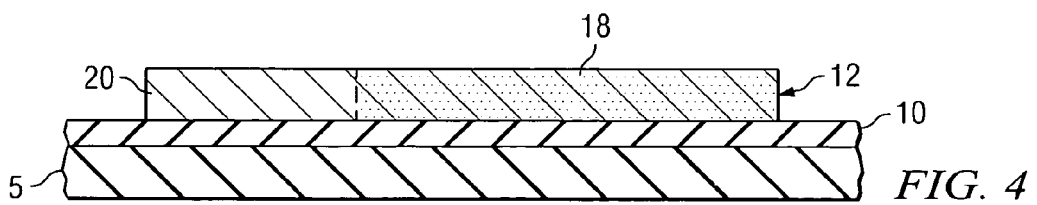

Referring to FIG. 4, mask layer 14 is removed. An annealing step may be performed after process 16 is performed and either before or after mask layer 14 is removed to enable the newly introduced atoms to be suitably placed within exposed portion 18, hereinafter referred to as composition-altered portion 18. Mask layer 14 may be removed according to any etching process compatible with the composition of mask layer 14. Removal of mask layer 14 exposes metal layer 12 in order to perform further semiconductor fabrication. According to the illustrated embodiment, at this stage, metal layer 12 includes a composition-altered portion 18 comprising molybdenum nitride (MoN) and first portion 20 comprising molybdenum. According to another embodiment, composition-altered portion 18 may comprise molybdenum dinitride ($MoN_2$), or any other molybdenum compound suitable for yielding a desired work function.

Figure 5:
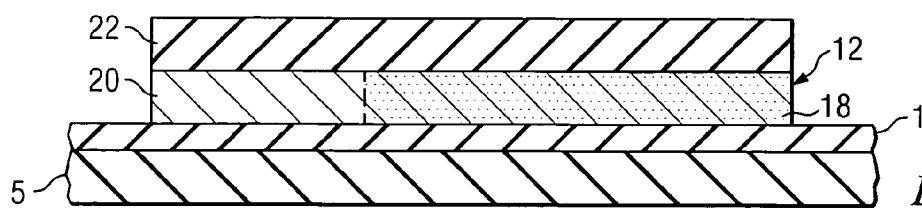

Referring to FIG. 5, a barrier layer 22 is deposited outwardly from metal layer 12. Barrier layer 22 comprises a substantially uniform layer of any thickness and composition suitable for preventing reaction of the metal of metal layer 12 with adjacent layers of the semiconductor structure during thermal processing. For example, barrier layer 22 may include titanium nitride (TiN), tantalum nitride (TaN), fully nitrided molybdenum nitride (MoN), hafnium nitride (HfN), zirconium nitride (ZrN), or any other suitable material. According to the illustrated embodiment, barrier layer 22 has a thickness in a range between 10 angstroms and 100 angstroms.

Figure 6:
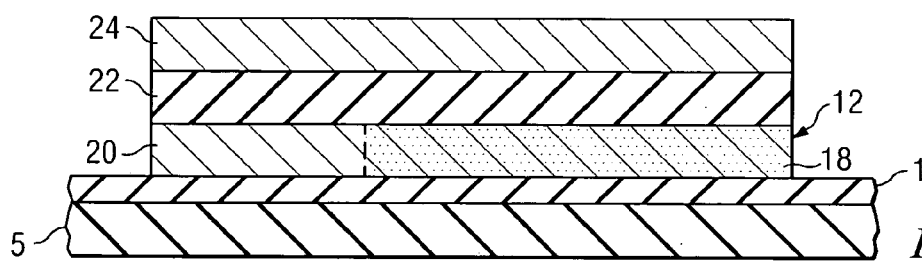

Referring to FIG. 6, a poly-Si layer 24 is deposited outwardly from barrier layer 22. According to the illustrated embodiment, poly-Si layer 24 may include a substantially uniform layer of poly-Si of a thickness sufficient to yield a semiconductor layer 30 having a thickness of, for example, approximately 1000 angstroms. Any other suitable thickness of poly-Si layer may be used depending on the application.

Figure 7:
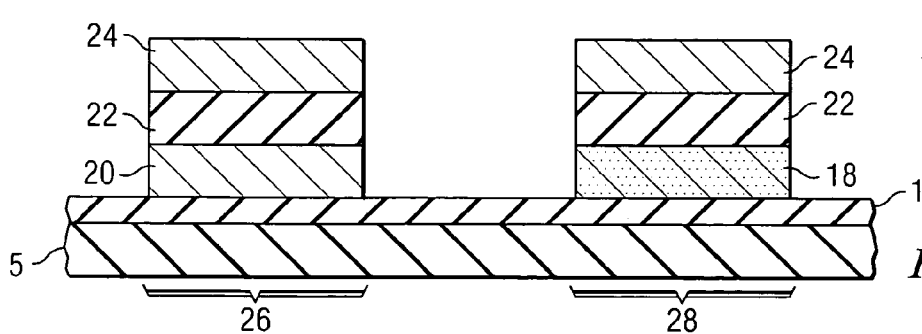

Referring to FIG. 7, after depositing poly-Si layer 24, semiconductor layer 30 may be patterned and etched to form a gate structure having metal gates with multiple work functions. For example, semiconductor layer 30 may be patterned and etched to yield at least two gate electrodes. A first gate stack 26 comprises a first gate electrode having a work function appropriate for a PMOS device, and a second gate stack 28 comprises a second gate electrode having a work function appropriate for an NMOS device. According to the illustrated embodiment, first gate stack 26 includes a portion of dielectric layer 10, first portion 20 of metal layer 12, a portion of barrier layer 22, and a portion of poly-Si layer 24 stacked as shown in FIG. 7. According to the illustrated embodiment, second gate stack 28 includes a portion of dielectric layer 10, at least part of composition-altered layer 18, a portion of barrier layer 22, and a portion of poly-Si layer 24 stacked as shown in FIG. 7. Although first gate stack 26 and second gate stack 28 may be of substantially similar dimensions, first gate stack 26 may have different dimensions from second gate stack 28 without departing from the scope of the invention. For example, first gate stack 26 may be wider than second gate stack 28.

After depositing poly-Si layer 24, semiconductor layer 30 may undergo further manufacturing process stages to fabricate transistors according to the application. For example, semiconductor layer 30 may be treated with an anti-reflective coating during the etching and masking process to substantially eliminate the reflectivity of poly-Si layer 24. As another example, semiconductor layer 30 may be encapsulated to protect the metal layers of first gate stack 26 and second gate stack 28 during the fabrication process.

Certain embodiments of the invention may provide one or more technical advantages. A technical advantage of one embodiment may include a barrier layer that prevents reaction of the metal layer with adjacent layers in order to inhibit the formation of metal compounds. Use of a barrier layer may allow the use of a metal layer in semiconductor fabrication, while maintaining the integrity of the metal layer throughout the thermal budget of the device. Another technical advantage may be that a thin metal layer may be used, which may allow for more effective etching of the gate stack. Yet another technical advantage of one embodiment may be that a dual work function gate structure using metal gates may be obtained. Yet another technical advantage of one embodiment may be that a metal layer may be used to effectively control implantation of atoms into the metal layer, which may prevent possible damage to the gate dielectric.

Although an embodiment of the invention and its advantages are described in detail, a person skilled in the art could make various alterations, additions, and omissions without departing from the spirit and scope of the present invention as defined by the appended claims.

What is claimed is:

1. A method of fabricating a semiconductor, comprising:
depositing a metal layer outwardly from a dielectric layer;
forming a mask layer outwardly from a first portion of the metal layer, the mask layer masking the first portion of the metal layer;
incorporating a plurality of atoms into an exposed second portion of the metal layer to form a composition-altered portion of the metal layer;
removing the mask layer from the first portion of the metal layer;
depositing a barrier layer outwardly from the first portion and the second portion of the metal layer;
depositing a poly-Si layer outwardly from the barrier layer to form a semiconductor layer, the barrier layer operable to substantially prevent diffusion and reaction between the metal layer and the poly-Si layer; and
etching the semiconductor layer to form a gate stack structure, the gate stack structure comprising a first gate electrode and a second gate electrode, the first gate electrode comprising at least part of the first portion of the metal layer and operating according to a first work function, the second gate electrode comprising at least part of the composition-altered portion of the metal layer and operating according to a second work function.

2. The method of claim 1, wherein the metal layer has a thickness in a range between a monolayer and 500 angstroms.

3. The method of claim 1, wherein the metal layer comprises molybdenum (Mo).

4. The method of claim 1, wherein the composition-altered portion of the metal layer comprises molybdenum nitride (MoN).

5. The method of claim 1, wherein incorporating a plurality of atoms into the exposed second portion of the metal layer to form a composition-altered portion of the metal layer further comprises using at least one of an ion implantation, a direct plasma nitridation, a remote plasma nitridation, an ammonia anneal, a $S_iH_4$ anneal, and a $Si_2H_6$ anneal.

6. The method of claim 1, wherein the plurality of atoms comprises a plurality of nitrogen atoms.

7. The method of claim 1, wherein the plurality of atoms comprises a plurality of silicon atoms.

8. The method of claim 1, wherein the barrier layer has a thickness in a range between 10 angstroms and 100 angstroms.

9. The method of claim 1, wherein the barrier layer comprises a compound selected from one of a titanium nitride (TiN) compound, a tantalum nitride (TaN) compound, a molybdenum nitride (MoN) compound, a hafnium nitride (HfN) compound, and a zirconium nitride (ZrN) compound.

10. The method of claim 1, wherein:
the first work function corresponds to a p-channel metal oxide semiconductor (PMOS); and
the second work function corresponds to an n-channel metal oxide semiconductor (NMOS).

11. The method of claim 1, wherein the plurality of atoms comprises a plurality of carbon atoms.

12. The method of claim 1, wherein the plurality of atoms comprises a plurality of boron atoms.

13. A method of fabricating a semiconductor, comprising:
depositing a metal layer outwardly from a dielectric layer, the metal layer comprising molybdenum (Mo) and having a thickness in a range between one monolayer and 500 angstroms;
forming a mask layer outwardly from a first portion of the metal layer, the mask layer masking the first portion of the metal layer;
incorporating a plurality of nitrogen atoms into an exposed second portion of the metal layer to form a composition-altered portion of the metal layer comprising molybdenum nitride (MoN) by using at least one of a direct plasma nitridation, a remote plasma nitridation, and an ammonia anneal;
removing the mask layer from the first portion of the metal layer;
depositing a barrier layer outwardly from the first portion and the second portion of the metal layer;
depositing a poly-Si layer outwardly from the barrier layer to form a semiconductor layer, the barrier layer operable to substantially prevent diffusion and reaction between the metal layer and the poly-Si layer; and
etching the semiconductor layer to form a gate stack structure, the gate stack structure comprising a first gate electrode and a second gate electrode, the first gate electrode comprising at least part of the first portion of the metal layer and operating according to a first work function, the second gate electrode comprising at least part of the composition-altered portion of the metal layer and operating according to a second work function.

14. The method of claim 13, wherein:
the barrier layer has a thickness in a range between 10 angstroms and 100 angstroms;
the barrier layer comprises a compound selected from one of a titanium nitride (TiN) compound, a tantalum nitride (TaN) compound, a molybdenum nitride (MoN) compound, a hafnium nitride (HfN) compound, and a zirconium nitride (ZrN) compound;
the first work function corresponds to a p-channel metal oxide semiconductor (PMOS); and
the second work function corresponds to an n-channel metal oxide semiconductor (NMOS).

15. A method of fabricating a semiconductor, comprising:
depositing a metal layer outwardly from a dielectric layer;
forming a mask layer outwardly from a first portion of the metal layer, the mask layer masking the first portion of the metal layer;
incorporating a plurality of atoms into an exposed second portion of the metal layer to form a composition-altered portion of the metal layer using at least one of a direct plasma nitridation, a remote plasma nitridation, an ammonia anneal, a $S_iH_4$ anneal, and a $Si_2H_6$ anneal;
removing the mask layer from the first portion of the metal layer;
depositing a barrier layer outwardly from the first portion and the second portion of the metal layer;
depositing a poly-Si layer outwardly from the barrier layer to form a semiconductor layer, the barrier layer operable to substantially prevent diffusion and reaction between the metal layer and the poly-Si layer; and
etching the semiconductor layer to form a gate stack structure, the gate stack structure comprising a first gate electrode and a second gate electrode, the first gate electrode comprising at least part of the first portion of the metal layer and operating according to a first work function, the second gate electrode comprising at least part of the composition-altered portion of the metal layer and operating according to a second work function.

* * * * *